US008417485B2

(12) United States Patent
Grandine et al.

(10) Patent No.: US 8,417,485 B2
(45) Date of Patent: Apr. 9, 2013

(54) CONSTRUCTING COMPUTER AIDED DESIGN MODELS FROM PROCEDURALLY DEFINED CURVE AND SURFACE LOFTS

(75) Inventors: Thomas A. Grandine, Issaquah, WA (US); Thomas A. Hogan, Seattle, WA (US)

(73) Assignee: The Boeing Company, Chicago, IL (US)

( * ) Notice: Subject to any disclaimer, the term of this patent is extended or adjusted under 35 U.S.C. 154(b) by 1127 days.

(21) Appl. No.: 12/351,250

(22) Filed: Jan. 9, 2009

(65) Prior Publication Data
US 2010/0177103 A1 Jul. 15, 2010

(51) Int. Cl.
*G06F 17/50* (2006.01)
(52) U.S. Cl. .................. 703/1; 700/97; 700/98
(58) Field of Classification Search ... 703/1; 700/97–98
See application file for complete search history.

(56) References Cited

U.S. PATENT DOCUMENTS

| 5,608,855 | A  | * | 3/1997 | Harashima | 345/442 |
| 6,256,038 | B1 | * | 7/2001 | Krishnamurthy | 345/419 |
| 7,755,623 | B2 | * | 7/2010 | Rockwood et al. | 345/420 |
| 7,805,442 | B1 | * | 9/2010 | Joshi et al. | 707/736 |

OTHER PUBLICATIONS

Eikott at al. "CAD-based sampling for CMM inspection of models with sculptured features"., Springer-Verlag London Limited 2007. p. 187-206.*

* cited by examiner

*Primary Examiner* — Eunhee Kim
(74) *Attorney, Agent, or Firm* — Yee & Associates, P.C.

(57) ABSTRACT

The advantageous embodiments provide a computer implemented method, apparatus, and computer program product for constructing a computer aided design model. User input is received that contains a callback function and a required accuracy. The callback function prescribes a procedurally defined geometry and the required accuracy specifies the degree of accuracy needed for the computer aided design model. The callback function is sampled at a number of points to form sampled points and a candidate curve is constructed that approaches the sampled points. A determination is made as to whether the candidate curve meets the required accuracy.

35 Claims, 12 Drawing Sheets

CONSTRUCTING COMPUTER AIDED DESIGN MODELS FROM PROCEDURALLY DEFINED CURVE AND SURFACE LOFTS

BACKGROUND INFORMATION

1. Field

The present disclosure relates generally to an improved data processing system, and more specifically, to converting procedurally defined geometry models of curves and surfaces into computer aided design models which approximate the procedurally defined geometry models.

2. Background

Geometric models are important in the design and manufacture of products. Procedurally defined geometric models are useful and accurate, but cannot be written out to standard geometry transfer and archival format files such as Initial Graphics Exchange Specification (IGES) files or Standard for the Exchange of Product Model Data (STEP) files. This constraint limits procedurally defined geometric models to the systems in which they are written. In order to transfer procedurally defined geometric models, a human user must determine the number and location of sample points, and transfer those points to a target system. The curves and surfaces defined by the procedure are then rebuilt from the transferred sample points using the curve and surface reconstruction tools in the target system.

In order to achieve a measure of accuracy in the reconstructed curve or surface, the procedurally defined geometric model must be over-sampled, which results in large data transfers of frequently unnecessary data. With or without the large number of samples, the target system will reconstruct the curve or surface using its own curve or surface fit, resulting in different curve and surface models in each of the target systems. Additionally, each target system may have multiple methods available for performing the curve and surface fit, resulting in different models produced within a given target system, often dependent upon the personal preference of the user inputting the sample points.

Therefore, it would be advantageous to have a method and apparatus that takes into account one or more of the issues discussed above as well as possibly other issues.

SUMMARY

The different advantageous embodiments provide a computer implemented method, apparatus, and computer program product for constructing a computer aided design model. User input is received that contains a callback function and a required accuracy. The callback function contains a procedurally defined geometry and the required accuracy specifies the degree of accuracy needed for the computer aided design model. The callback function is sampled at a number of points to form sampled points and a candidate curve is constructed that approaches the sampled points. A determination is made as to whether the candidate curve meets the required accuracy.

In another advantageous embodiment, input is received that comprises a callback function and a required accuracy. The callback function contains a procedurally defined geometry and the required accuracy specifies the degree of accuracy needed for the computer aided design model of the object. The callback function is sampled, by a processor unit, at a number of curves to form sampled curves. A candidate surface is constructed that approaches the sampled curves. A determination is made as to whether the candidate surface meets the required accuracy.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
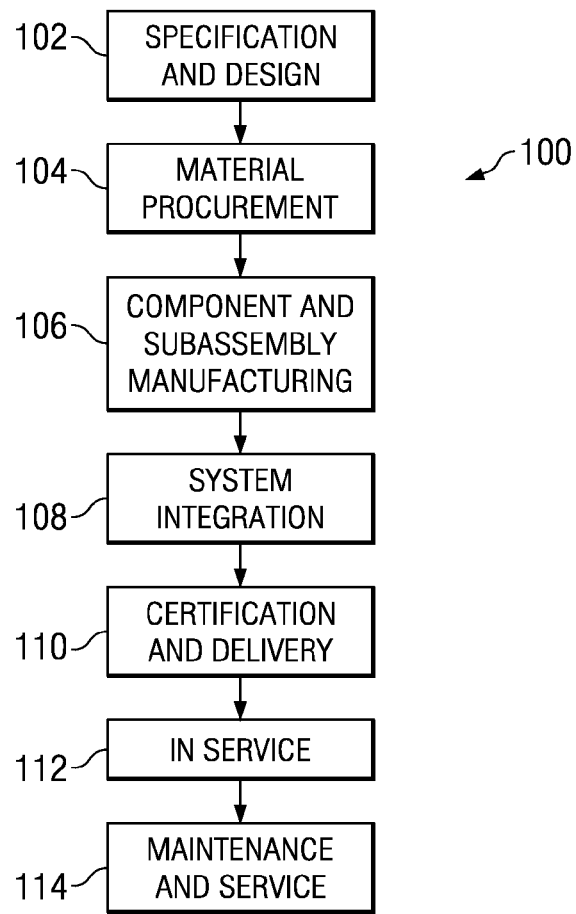
FIG. 1 is a diagram illustrating an aircraft manufacturing and service method in which an advantageous embodiment may be implemented.
Figure 2:
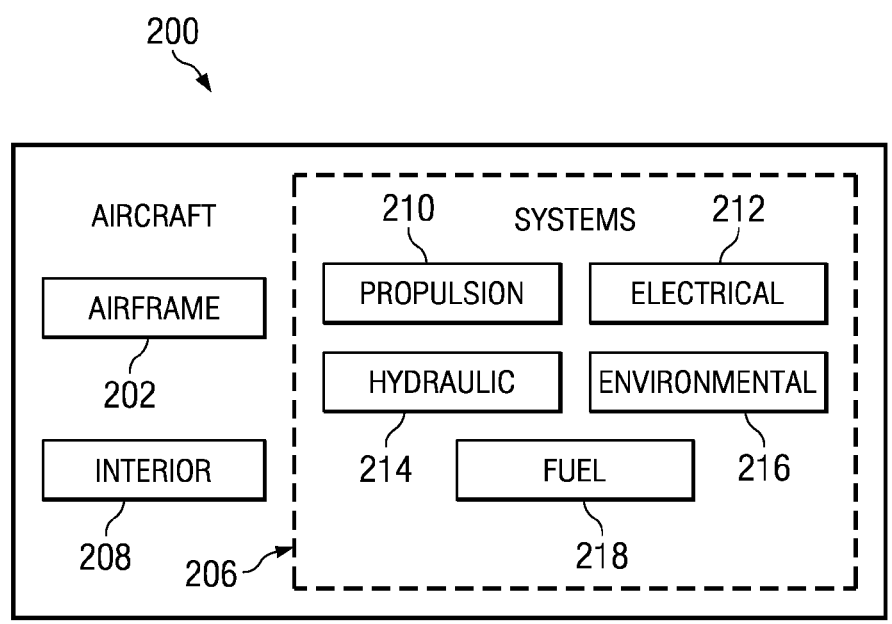
FIG. 2 is a diagram of an aircraft in which an advantageous embodiment may be implemented.

Referring more particularly to the drawings, embodiments of the disclosure may be described in the context of the aircraft manufacturing and service method 100 as shown in FIG. 1 and aircraft 200 as shown in FIG. 2. Turning first to FIG. 1, a diagram illustrating an aircraft manufacturing and service method is depicted in accordance with an advantageous embodiment. During pre-production, exemplary aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, a diagram of an aircraft is depicted in which an advantageous embodiment may be implemented. In this example, aircraft 200 is produced by aircraft manufacturing and service method 100 in FIG. 1 and may include airframe 202 with a plurality of systems 206 and interior 208. Examples of systems 206 include one or more of propulsion system 210, electrical system 212, hydraulic system 214, environmental system 216 and fuel system 218. Any number of other systems may be included. Although an aerospace example is shown, different advantageous embodiments may be applied to other industries, such as the automotive industry.

Apparatus and methods embodied herein may be employed during any one or more of the stages of aircraft manufacturing and service method 100 in FIG. 1. For example, designs generated during specification and design 102 in FIG. 1 may be procured while aircraft 200 is in maintenance and service 114 in FIG. 1.

Also, one or more apparatus embodiments, method embodiments, or a combination thereof may be utilized during production stages, such as component and subassembly manufacturing 106 and system integration 108 in FIG. 1, for example, without limitation, by substantially expediting the assembly of or reducing the cost of aircraft 200. Similarly, one or more of apparatus embodiments, method embodiments, or a combination thereof may be utilized while aircraft 200 is in service 112 or during maintenance and service 114 in FIG. 1.

For example, different advantageous embodiments may be employed to construct computer aided design models for a component design during specification and design 102. Advantageous embodiments also may be implemented to construct computer aided design models for a component design during component and subassembly manufacturing 106, system integration 108, and/or maintenance and service 114.

The different advantageous embodiments recognize and take into account that currently used systems for constructing computer aided design models from procedurally defined geometric models rely upon a human user to sample points along the procedurally defined geometric model and input the sampled points into a computer aided design system. The different advantageous embodiments recognize that the number and location of the points which need to be sampled in order to achieve a degree of accuracy cannot be known in advance. The different advantageous embodiments also recognize that currently used systems may cope with this problem by over sampling the procedurally defined geometric model, resulting in large data transfers of frequently unnecessary data.

The different advantageous embodiments also recognize and take into account that different computer aided design systems for constructing a computer aided design model each have unique processes for performing a curve or surface fit, and in many cases, have multiple processes within a given computer aided design system for performing a curve or surface fit. The different advantageous embodiments recognize that this leads to different models produced in any given system at different times.

Thus, the different advantageous embodiments provide a method, apparatus, and computer program product for constructing a computer aided design model. User input is received that contains a callback function and a required accuracy. The callback function specifies a procedurally defined geometry and the required accuracy specifies the degree of accuracy needed for the computer aided design model. The callback function is sampled at a number of points to form sampled points and a candidate curve is constructed that approaches the sampled points. A determination is made as to whether the candidate curve meets the required accuracy. A number as used herein refers to one of more items. For example, a number of points is one or more points.

Figure 3:
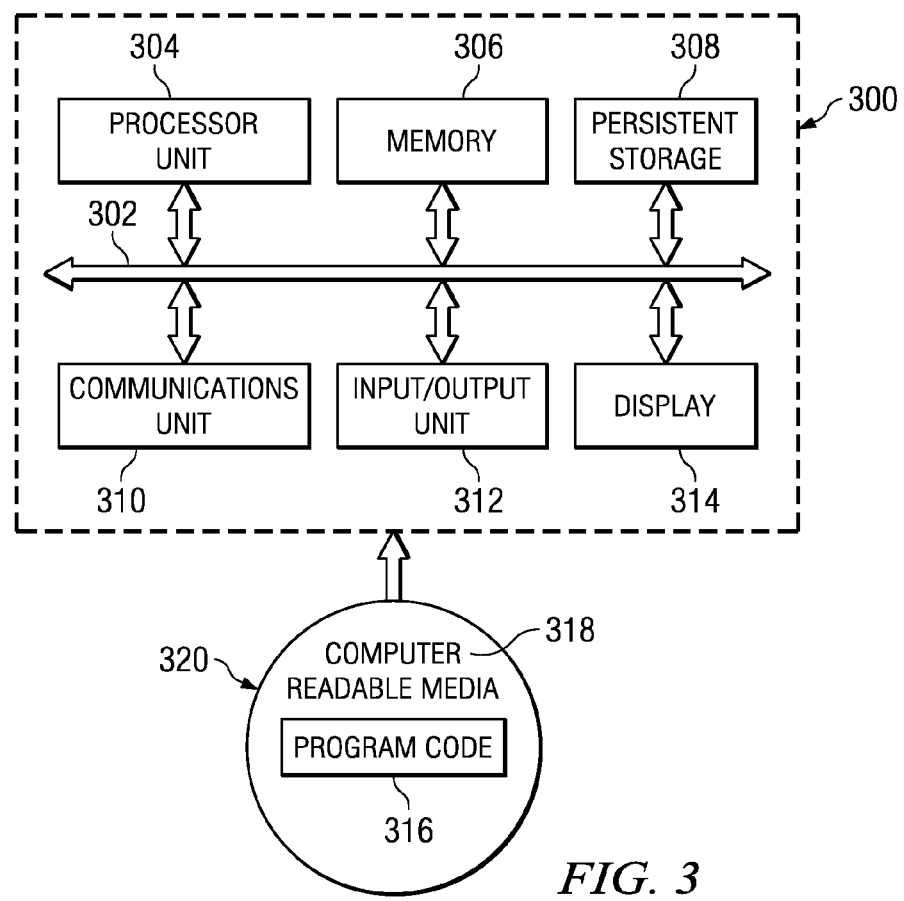
FIG. 3 is a diagram of a data processing system in accordance with an advantageous embodiment.

Turning now to FIG. 3, a diagram of a data processing system is depicted in accordance with an advantageous embodiment. Data processing system 300 may be used to implement various computers and/or devices used in the different advantageous embodiments. Network data processing system 300 may be used during aircraft manufacturing and service method 100 in FIG. 1. For example, data processing system 300 may be used to implement the advantageous embodiments during various steps and/or phases of aircraft manufacturing and service method 100.

In this illustrative example, data processing system 300 includes communications fabric 302, which provides communications between processor unit 304, memory 306, persistent storage 308, communications unit 310, input/output (I/O) unit 312, and display 314.

Processor unit 304 serves to execute instructions for software that may be loaded into memory 306. Processor unit 304 may be a set of one or more processors or may be a multi-processor core, depending on the particular implementation. Further, processor unit 304 may be implemented using one or more heterogeneous processor systems in which a main processor is present with secondary processors on a single chip. As another illustrative example, processor unit 304 may be a symmetric multi-processor system containing multiple processors of the same type.

Memory 306 and persistent storage 308 are examples of storage devices. A storage device is any piece of hardware that is capable of storing information either on a temporary basis and/or a permanent basis. Memory 306, in these examples, may be, for example, a random access memory or any other suitable volatile or non-volatile storage device.

A storage device, as used herein, is hardware that is capable of storing computer program code in the functional form and/or data. Persistent storage 308 may take various forms depending on the particular implementation. For example, persistent storage 308 may contain one or more components or devices. For example, persistent storage 308 may be a hard drive, a flash memory, a rewritable optical disk, a rewritable magnetic tape, or some combination of the above. The media used by persistent storage 308 also may be removable. For example, a removable hard drive may be used for persistent storage 308.

Communications unit 310, in these examples, provides for communications with other data processing systems or devices. In these examples, communications unit 310 is a network interface card. Communications unit 310 may provide communications through the use of either or both physical and wireless communications links.

Input/output unit 312 allows for input and output of data with other devices that may be connected to data processing system 300. For example, input/output unit 312 may provide a connection for user input through a keyboard and mouse. Further, input/output unit 312 may send output to a printer. Display 314 provides a mechanism to display information to a user.

Instructions for the operating system and applications or programs are located on persistent storage 308. These instructions may be loaded into memory 306 for execution by processor unit 304. The processes of the different embodiments may be performed by processor unit 304 using computer implemented instructions, which may be located in a memory, such as memory 306. These instructions are referred to as program code, computer usable program code, or computer readable program code that may be read and executed by a processor in processor unit 304. The program code in the different embodiments may be embodied on different physical or tangible computer readable media, such as memory 306 or persistent storage 308.

Program code 316 is located in a functional form on computer readable media 318 that is selectively removable and may be loaded onto or transferred to data processing system 300 for execution by processor unit 304. Program code 316 and computer readable media 318 form computer program product 320 in these examples. In one example, computer readable media 318 may be in a tangible form, such as, for example, an optical or magnetic disc that is inserted or placed into a drive or other device that is part of persistent storage 308 for transfer onto a storage device, such as a hard drive that is part of persistent storage 308. In a tangible form, computer readable media 318 also may take the form of a persistent storage, such as a hard drive, a thumb drive, or a flash memory that is connected to data processing system 300. The tangible form of computer readable media 318 is also referred to as computer recordable storage media. In some instances, computer readable media 318 may not be removable.

Alternatively, program code 316 may be transferred to data processing system 300 from computer readable media 318 through a communications link to communications unit 310 and/or through a connection to input/output unit 312. The communications link and/or the connection may be physical or wireless in the illustrative examples. The computer readable media also may take the form of non-tangible media, such as communications links or wireless transmissions containing the program code.

In some advantageous embodiments, program code 316 may be downloaded over a network to persistent storage 308 from another device or data processing system for use within data processing system 300. For instance, program code stored in a computer readable storage medium in a server data processing system may be downloaded over a network from the server to data processing system 300. The data processing system providing program code 316 may be a server computer, a client computer, or some other device capable of storing and transmitting program code 316.

The different components illustrated for data processing system 300 are not meant to provide architectural limitations to the manner in which different embodiments may be implemented. The different advantageous embodiments may be implemented in a data processing system including components in addition to or in place of those illustrated for data processing system 300. Other components shown in FIG. 3 can be varied from the illustrative examples shown. The different embodiments may be implemented using any hardware device or system capable of executing program code. As one example, the data processing system may include organic components integrated with inorganic components and/or may be comprised entirely of organic components excluding a human being. For example, a storage device may be comprised of an organic semiconductor.

As another example, a storage device in data processing system 300 is any hardware apparatus that may store data. Memory 306, persistent storage 308 and computer readable media 318 are examples of storage devices in a tangible form.

In another example, a bus system may be used to implement communications fabric 302 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 306 or a cache such as found in an interface and memory controller hub that may be present in communications fabric 302.

Figure 4:
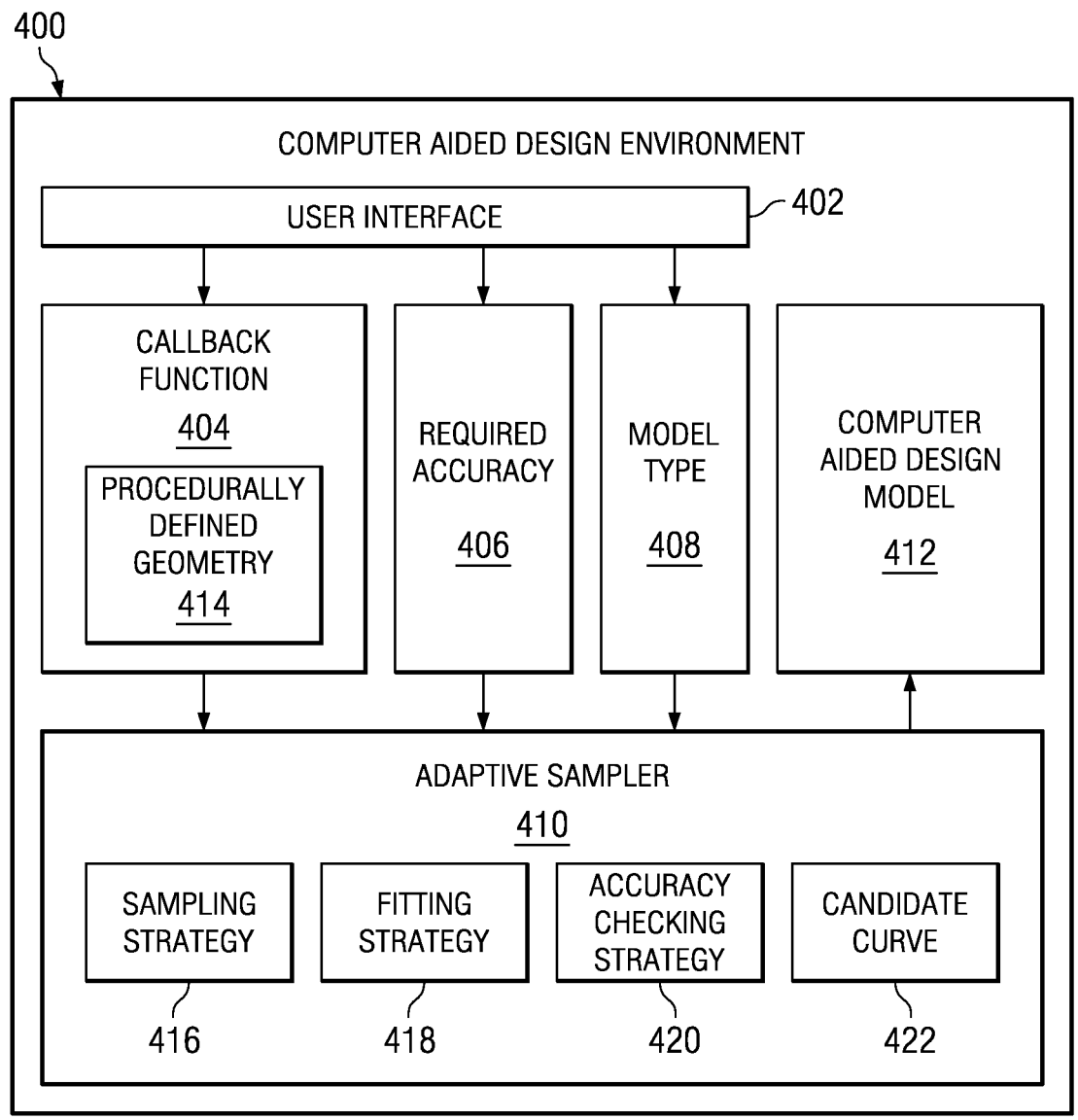
FIG. 4 is a diagram of a computer aided design environment in accordance with an advantageous embodiment.

With reference now to FIG. 4, a diagram of a computer aided design environment is depicted in accordance with an advantageous embodiment. Computer aided design environment 400 may be implemented in a number of data processing systems, such as data processing system 300 in FIG. 3. Computer aided design environment 400 may be used during manufacturing and service methods, such as specification and design 102 in FIG. 1.

Computer aided design environment 400 includes user interface 402, callback function 404, required accuracy 406, model type 408, adaptive sampler 410, and computer aided design model 412. User interface 402 allows for the input of data into adaptive sampler 410, as well as displaying output from adaptive sampler 410. User interface 402 may be, in one advantageous embodiment, presented on a display monitor, such as display 314 in FIG. 3.

Callback function 404 includes procedurally defined geometry 414. Procedurally defined geometry 414 is a function defining any curve or surface for which points can be computed on the curve or surface by calling a procedure or function. Procedurally defined geometry 414 may also be referred to as a procedurally defined curve or surface.

Mathematically, a curve is a function with one independent variable, or input, and at least two dependent variables, or outputs. Often, the domain of the function is the interval $[0,1]$. That is, for any input, t, with $0 \leq t \leq 1$, the output, f(t) is a point on the curve. Geometrically, the curve is the locus of all points f(t) as t ranges over every value from 0 to 1. For a planar curve, i.e., a two-dimensional curve, f(t) has two components: $f(t)=(x(t), y(t))$. For a space curve, i.e., a three-dimensional curve, f(t) has three components: $f(t)=(x(t), y(t), z(t))$. The curve is parametrized by t, or f is a parametric curve with parameter t.

Similarly, a surface is a function, f, defined on the square $[0,1] \times [0,1]$. For each u and v with $0 < u, v < 1$, $f(u,v)=(x(u,v), y(u,v), z(u,v))$ is a point on the surface and, geometrically, the surface consists of the collection of all such points. Again, f is said to be parametric, or parametrized by the parameters u and v.

If the function, f, defining a curve is a spline, it is referred to as a parametric spline curve. A spline is a special function defined piecewise by polynomials. A polynomial is an expression constructed from variables and constants, using the operations of addition, subtraction, multiplication, and constant non-negative whole number exponents. In this case, there are several standard file formats for storing a parametric spline curve, such as Initial Graphics Exchange Specification (IGES) or Standard for the Exchange of Product Model Data (STEP). Standard computer aided design systems provide means for reading curves and surfaces in at least one of these formats. As used herein, the term computer aided design model refers to any curve or surface represented as a parametric spline.

If a function, f, is an arbitrary curve, there is no standard file format for storing it in a file that can be read into any existing computer aided design systems. Procedurally defined curves and surfaces are not, in general, computer aided design models because they are not one of the standard canonical computer aided design model formats.

Required accuracy 406 is an expression of the accuracy needed for the curve or surface that adaptive sampler 410 will construct as computer aided design model 412. Required accuracy 406 provides a known quantity for the points that must be sampled from the initial geometry, such as procedurally defined geometry 414 within callback function 404. For example, in an advantageous embodiment, if the accuracy needs to be within two digits, required accuracy 406 may be expressed as [0.01]. In another illustrative example, if the accuracy needs to be within four digits, required accuracy 406 may be expressed as [0.0001].

Model type 408 defines the type of geometry adaptive sampler 410 will produce. Model type 408 may include, for example, without limitation, linear geometry, quadratic geometry, cubic geometry, and/or a degree of the specified geometry. Model type 408 is used by adaptive sampler 410 to determine a spline basis for a geometric approximation, such as candidate curve 422.

In an advantageous embodiment, callback function 404, required accuracy 406, and model type 408 are received from user input through user interface 402. As used herein, user input may be received from a human user or a data processing system. For example, in an advantageous embodiment, a human user may input a procedural definition of a curve or surface for which a computer aided design model is needed. The human user may create a callback function prescribing the procedurally defined curve or surface in this illustrative example. In another advantageous embodiment, for example, a data processing system may have a procedurally defined curve or surface for which a computer aided design model is needed, and the data processing system may create a callback function and input the callback function without any human intervention.

Adaptive sampler 410 receives callback function 404, required accuracy 406, and model type 408, and produces computer aided design model 412. Computer aided design model 412 is a spline function, or a curve or surface represented as a parametric spline. In other words, adaptive sampler 410 converts procedurally defined geometry 414 prescribed by callback function 404 to computer aided design model 412.

Adaptive sampler 410 includes sampling strategy 416, fitting strategy 418, accuracy checking strategy 420, and candidate curve 422. When adaptive sampler 410 receives callback function 404, required accuracy 406, and model type 408, adaptive sampler 410 invokes sampling strategy 416 and fitting strategy 418 to produce candidate curve 422. Sampling strategy 416 samples callback function 404 at a number of points along procedurally defined geometry 414.

Sampling strategy 416 determines an initial number of points needed to minimally achieve the type of geometry model, or spline basis, specified by model type 408. For example, without limitation, in an advantageous embodiment, if model type 408 requires a linear geometry, the minimum necessary points needed to construct the linear geometry may be two points. In another advantageous embodiment, for example, without limitation, if model type 408 requires a quadratic geometry, the minimum necessary points needed to construct the quadratic geometry may be three points. Sampling strategy 416 samples callback function 404 at the minimum necessary points and additional points to obtain sampled points. As used herein, additional points refers to zero, one, or more points.

Fitting strategy 418 constructs candidate curve 422 using the sampled points. A candidate curve is a geometric approximation, or spline approximation. As used herein, candidate curve refers to a curve and/or surface. Sampling strategy 416 samples callback function 404 at additional points other than the points previously sampled to obtain comparison points, which are used by accuracy checking strategy 420 to compare candidate curve 422 to the comparison points. Accuracy checking strategy 420 determines if candidate curve 422 meets or exceeds the accuracy threshold defined by required accuracy 406.

Adaptive sampler 410 may repeatedly invoke sampling strategy 416, fitting strategy 418, and accuracy checking strategy 420 until candidate curve 422 meets required accuracy 406. When candidate curve 422 meets required accuracy 406, it is promoted to a final curve and output as computer aided design model 412.

The illustration of computer aided design environment 400 in FIG. 4 is not meant to imply physical or architectural limitations on the manner in which different advantageous embodiments may be implemented. Other components in addition or in place of the ones illustrated may be used. Some components may be unnecessary in some advantageous embodiments. Also, the blocks are presented to illustrate some functional components and combined and/or divided into different blocks when implemented in hardware and/or software. For example, in some advantageous embodiments, required accuracy 406 could be integrated with model type 408.

Figure 5:
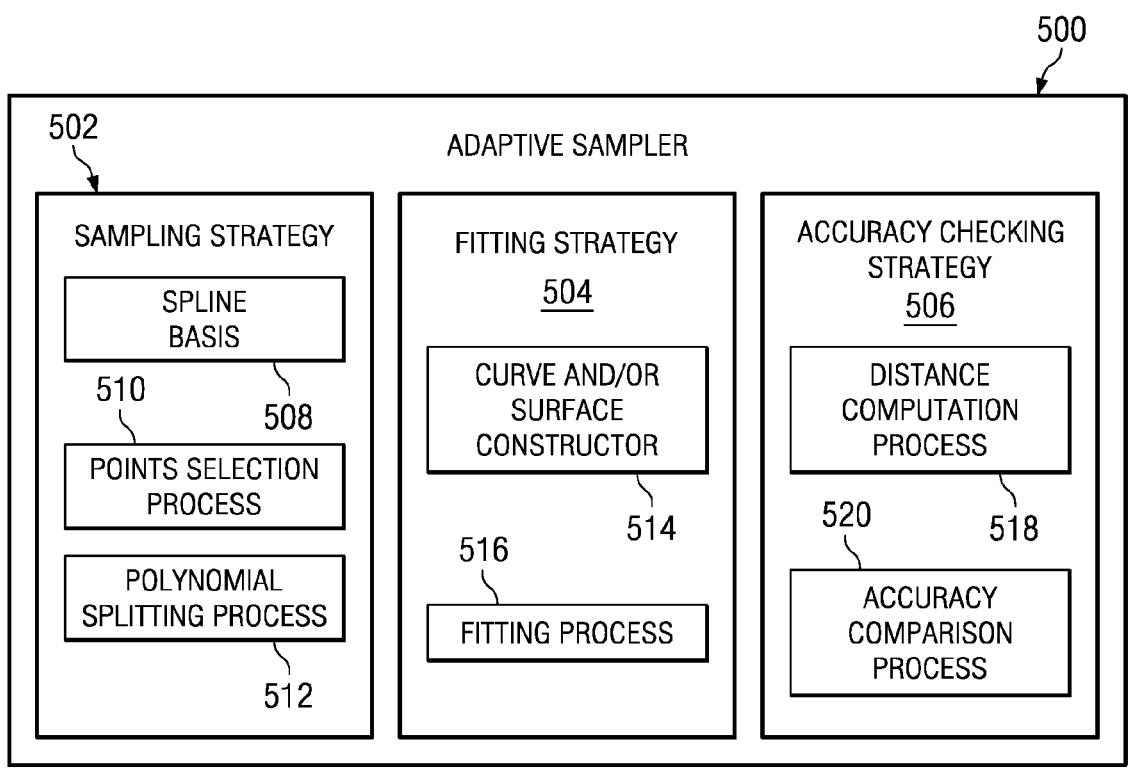
FIG. 5 is a diagram of an adaptive sampler in accordance with an advantageous embodiment.

With reference now to FIG. 5, a diagram of an adaptive sampler is depicted in accordance with an advantageous embodiment. Adaptive sampler 500 is an illustrative example of one implementation of adaptive sampler 410 in FIG. 4.

Adaptive sampler 500 includes sampling strategy 502, fitting strategy 504, and accuracy checking strategy 506. Sampling strategy 502 includes spline basis 508, points selection process 510, and polynomial splitting process 512. Spline basis 508 is an example of a type of geometry specified by model type 408 in FIG. 4. The type of geometry may be, for example, without limitation, piecewise linear geometry, piecewise quadratic geometry, piecewise cubic geometry, and/or a degree of the specified geometry. Sampling strategy 502 determines spline basis 508 based on user input, such as model type 408 in FIG. 4, and uses spline basis 508 with point selection process 510 to determine the minimal number of points and/or curves necessary to define spline basis 508.

Points selection process 510 also determines a number of additional points and/or curves to sample. Points selection process 510 may determine the number of points and/or curves to sample in order to construct a candidate curve or candidate surface, and a number of points and/or curves to sample in order to form comparison points and/or curves to compare the candidate curve or candidate surface with the original curve or surface provided in the callback function. For example, in an advantageous embodiment, for a procedurally defined geometry with the domain [0,1], points selection process 510 may choose to sample the callback function at points [0.25], [0.5], and [0.75] and then provide those points to fitting strategy 504 for curve and/or surface construction.

Polynomial splitting process 512 is used by sampling strategy 502 to split polynomial pieces into a number of additional polynomial pieces. As used herein, a number is two or more polynomial pieces. For example, if a polynomial piece is a region between values [0.25] and [0.5] on a curve with the domain [0,1], splitting the polynomial piece into two polynomial pieces may result in a polynomial piece for the region between values [0.25] and [0.375], and a polynomial piece for the region between values [0.375] and [0.5].

Fitting strategy 504 includes curve and/or surface constructor 514 and fitting process 516. Curve and/or surface constructor 514 takes the number of points sampled by sampling strategy 502 and constructs a candidate curve and/or candidate surface that approaches those points as closely as possible using fitting process 516. In an advantageous embodiment, fitting process 516 may be, for example, without limitation, a least squares procedure, an interpolation process, or any geometric approximation scheme.

Accuracy checking strategy 506 includes distance computation process 518 and accuracy comparison process 520. Distance computation process 518 computes the distance between each comparison point and the candidate curve or surface. That computation is compared to the required accuracy by accuracy comparison process 520 to determine whether the candidate curve or surface meets or exceeds the required accuracy.

Figure 6:
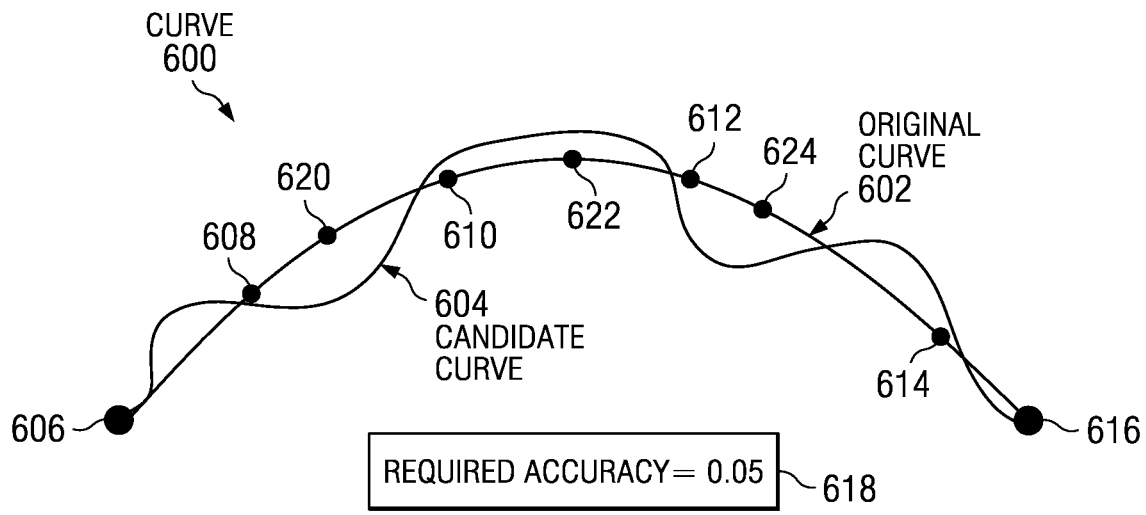
FIG. 6 is a diagram of a curve in accordance with an advantageous embodiment.

With reference now to FIG. 6, a block diagram of a curve is depicted in accordance with an advantageous embodiment. Curve 600 is an illustrative example of one embodiment of candidate curve 422 in FIG. 4.

Curve 600 includes a depiction of original curve 602 and candidate curve 604. Original curve 602 is an illustrative example of one implementation of procedurally defined geometry input 414 in FIG. 4. Candidate curve 604 is an illustrative example of one implementation of candidate curve 422 in FIG. 4.

Original curve 602 includes points 606, 608, 610, 612, 614, 616, 620, 622, and 624. Points 606, 608, 610, 612, 614, and 616 are an illustrative example of one implementation of sampled points selected by point selection process 510 in FIG. 5. In an illustrative embodiment, when adaptive sampler 500 in FIG. 5 uses points selection process 510 to sample the callback function, fitting strategy 504 constructs a curve that approaches points 606, 608, 610, 612, 614, and 616, resulting in candidate curve 604.

Required accuracy 618 specifies the accuracy needed for candidate curve 604. Required accuracy 618 is compared to a calculated distance between additional points and candidate curve 604.

For example, in an advantageous embodiment, adaptive sampler 500 in FIG. 5 uses points selection process 510 to sample at additional points between the sampled points to form comparison points 620, 622, and 624. If the distance between any comparison point and candidate curve 604 is greater than required accuracy 618, candidate curve 604 exceeds required accuracy 618. If candidate curve 604 exceeds required accuracy 618, a sampling strategy will be invoked again to sample the callback function at additional points, as illustrated further in FIG. 7.

Figure 7:
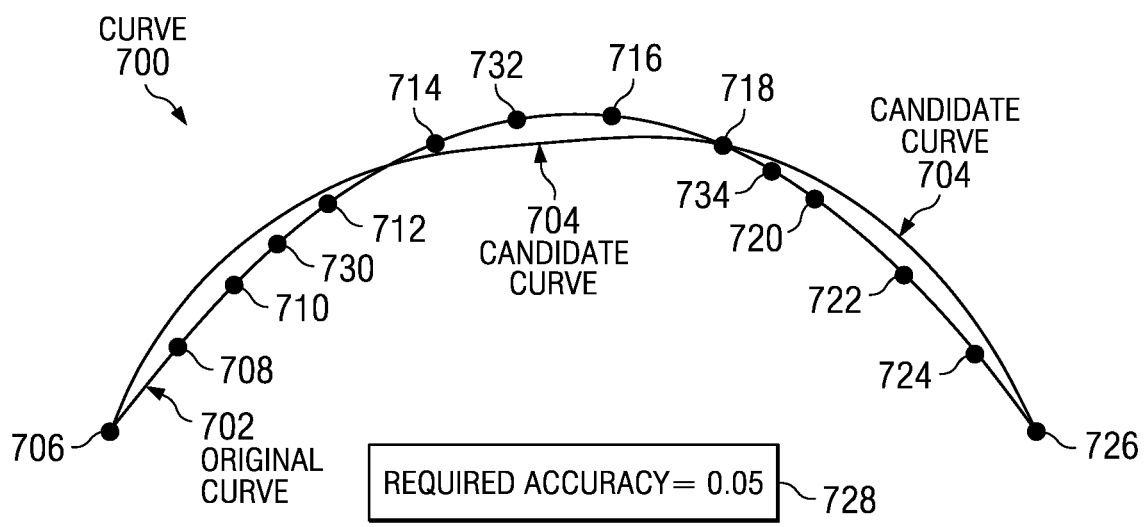
FIG. 7 is a diagram of a curve in accordance with an advantageous embodiment.

With reference now to FIG. 7, a diagram of a curve is depicted in accordance with an advantageous embodiment. Curve 700 is an illustrative example of one embodiment of candidate curve 422 in FIG. 4.

Curve 700 includes a depiction of original curve 702 and candidate curve 704. Original curve 702 is an illustrative example of one implementation of procedurally defined geometry input 414 in FIG. 4. Candidate curve 704 is an illustrative example of one implementation of candidate curve 422 in FIG. 4.

Candidate curve 704 includes points 706, 708, 710, 712, 714, 716, 718, 720, 722, 724, and 726. Points 706, 710, 714, 718, 722, and 726 are an illustrative example of one implementation of points 606, 608, 610, 612, 614, and 618 in FIG. 6. In other words, points 706, 710, 714, 718, 722, and 726 are an illustrative example of one implementation of the initial sampled points selected by points selection process 510 in FIG. 5.

Points 708, 712, 716, 720, and 724 are an illustrative example of one implementation of additional sampled points selected by points selection process 510 in FIG. 5 in response to the candidate curve constructed with the initial sampled points exceeding required accuracy 728. In an advantageous embodiment, when adaptive sampler 500 in FIG. 5 constructs a curve through an initial set of sampled points, the result is candidate curve 604 in FIG. 6.

Required accuracy 728, however, specifies a required accuracy for curve 700 that was not met by candidate curve 604 in FIG. 6. In an advantageous embodiment, when required accuracy 618 in FIG. 6 is compared to a calculated distance between each of points 606, 608, 610, 612, 614, and 618 in FIG. 6, the distance between candidate curve 604 and one or more of points 606, 608, 610, 612, 614, and 618 in FIG. 6 may be greater than the required accuracy specified by required accuracy 618. If the distance between any point and the candidate curve is greater than required accuracy, additional points may be sampled.

In an advantageous embodiment, where points 706, 710, 714, 718, 722, and 726 represent sampled points 606, 608, 610, 612, 614, and 618 in FIG. 6 that did not return a curve within the required accuracy, selection process 510 in FIG. 5 may sample at additional points 708, 712, 716, 720, and 724. Points 708, 712, 716, 720, and 724 are new points which are added to the sampled points 706, 710, 714, 718, 722, and 726. Curve fitting strategy 504 in FIG. 5 then constructs a curve that approaches sampled points 706, 708, 710, 712, 714, 716, 718, 720, 722, 724, and 726, resulting in candidate curve 704.

Required accuracy 728 specifies the accuracy needed for candidate curve 704. Required accuracy 728 is compared to a calculated distance between additional comparison points and candidate curve 704. For example, in an advantageous embodiment, adaptive sampler 500 in FIG. 5 uses points selection process 510 to sample at additional points between sampled points 706, 708, 710, 712, 714, 716, 718, 720, 722, 724, and 726 to form comparison points 730, 732, and 734.

If the distance between any comparison point and candidate curve 704 is greater than required accuracy 728, candidate curve 704 exceeds required accuracy 728. If candidate curve 704 meets required accuracy 728, candidate curve 704 may be promoted to a final curve and output as a computer aided design model.

Figure 8:
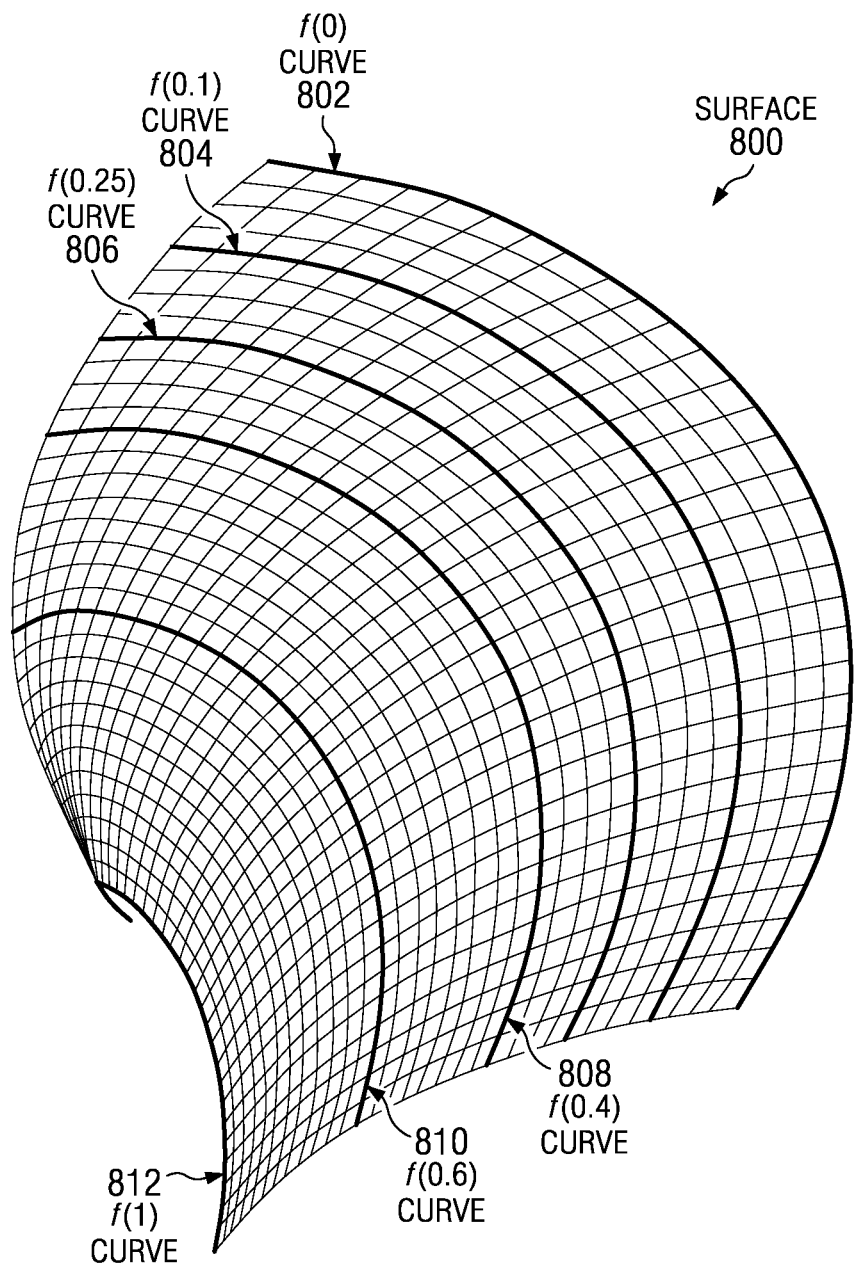
FIG. 8 is a diagram of a surface in accordance with an advantageous embodiment.

With reference now to FIG. 8, a diagram of a surface is depicted in accordance with an advantageous embodiment. Surface 800 is an illustrative example of one embodiment of a procedurally defined geometry, such as procedurally defined geometry 414 within callback function 404 in FIG. 4.

Surface 800 is an illustrative example of a procedurally defined geometry within a callback function that is sampled by an adaptive sampler, such as adaptive sampler 410 in FIG. 4, to return curves 802, 804, 806, 808, 810 and 812. Curves 802, 804, 806, 808, 810 and 812 are returned as spline representations.

In an illustrative example, curve 802 may be an example of one implementation of a candidate curve, such as candidate curve 604 in FIG. 6, or candidate curve 704 in FIG. 7. In other words, in one advantageous embodiment, curves 802, 804, 806, 808, 810 and 812 are an illustrative example of one implementation of candidate curves constructed by adaptive sampler 410 in FIG. 4. In one illustrative example, once a number of candidate curves are promoted to final curves by adaptive sampler 410 in FIG. 4, the candidate curves may be used to construct a candidate surface, such as surface 800, using adaptive sampler 410.

In another advantageous embodiment, curves 802, 804, 806, 808, 810 and 812 may be received as a callback function, which may be adaptively sampled to achieve a candidate surface until the candidate surface meets the required accuracy for the computer aided design model. In one illustrative example, the callback function may take a single value as input, such as [0.1] for example, and return a curve on the surface corresponding to that value, such as curve 804 for example. Additional possible outputs may be, for example, without limitation, outputs for the values of [0.25], [0.4], [0.6], and [1], which may return curves 806, 808, 810, and 812 respectively.

Curves 802, 804, 806, 808, 810 and 812 are an illustrative example of one implementation of the initial sampled curves selected by points selection process 510 in FIG. 5.

The different components illustrated for surface 800 are not meant to provide architectural limitations to the manner in which different embodiments may be implemented. The different advantageous embodiments may be implemented in a data processing system including components in addition to or in place of those illustrated for surface 800. Other components shown in FIG. 8 can be varied from the illustrative examples shown. As one example, more input values or fewer input values may be input into the callback function in any given embodiment.

Figure 9:
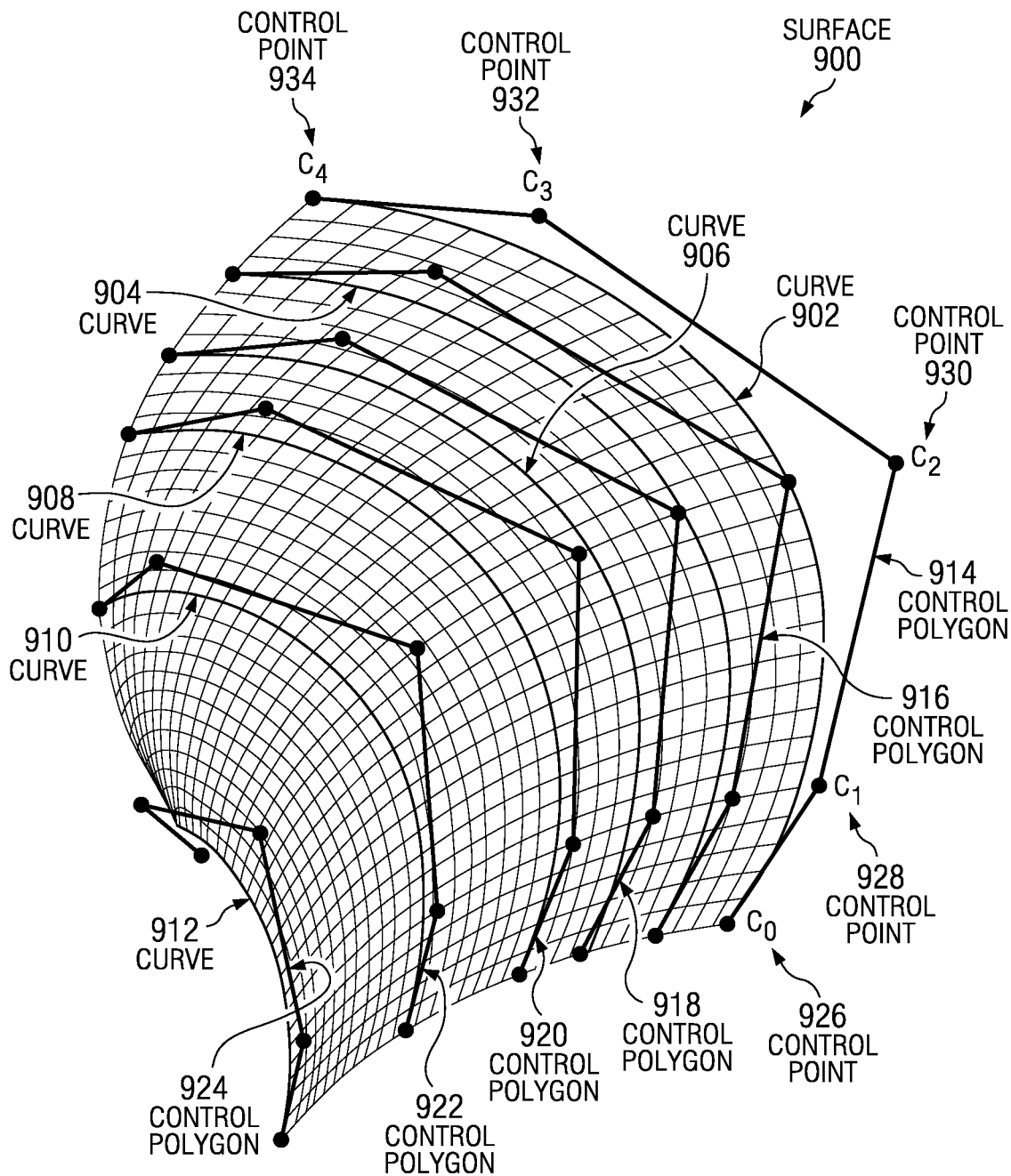
FIG. 9 is a diagram of a surface in accordance with an advantageous embodiment.

With reference now to FIG. 9, a diagram of a surface is depicted in accordance with an advantageous embodiment. Surface 900 is an illustrative example of one embodiment of a procedurally defined geometry, such as procedurally defined geometry 414 within callback function 404 in FIG. 4.

Curves 902, 904, 906, 908, 910, and 912 are an illustrative example of curves 802, 804, 806, 808, 810, and 812 in FIG. 8. After the callback function has been sampled for initial curves, such as curves 902, 904, 906, 908, 910, and 912, a control polygon is constructed for each initial curve.

A spline curve has a unique representation as a linear combination of B-splines: $\Sigma c_i B_i(t)$. When the coefficients $c_i$, which are three-dimensional vectors, are considered as points and connected, the resulting linear combination is called a control polygon. For example, curve 902 has control polygon 914, curve 904 has control polygon 916, curve 906 has control polygon 918, curve 908 has control polygon 920, curve 910 has control polygon 922, and curve 912 has control polygon 924.

In an illustrative example, control polygon 914 depicts the points, or coefficients, for curve 902 as control point[$c_0$] 926, control point[$c_1$] 928, control point [$c_2$] 930, control point [$c_3$] 932 and control point [$c_4$] 934. Each curve has unique control points that make up the control polygon for that curve.

Control points determine the shape of a curve. Generally, each point of a curve is computed by taking a weighted sum of a number of control points. The weight of each point varies according to the governing parameter. The weight changes according to a polynomial function of a certain degree.

For example, a polynomial function of degree one is a triangle function because the value of the polynomial rises from zero to one, then falls to zero again. When the value of the polynomial function for the current control point rises, the polynomial function of the previous control point falls, allowing the curve to interpolate between the two points and resulting in a curve that is a polygon, continuous but not differentiable at the interval boundaries or knots.

The different components illustrated for surface 900 are not meant to provide architectural limitations to the manner in which different embodiments may be implemented. The different advantageous embodiments may be implemented in a data processing system including components in addition to or in place of those illustrated for surface 900. Other components shown in FIG. 9 can be varied from the illustrative examples shown. As one example, more coefficients or fewer coefficients may be represented for a spline curve in a given embodiment.

Figure 10:
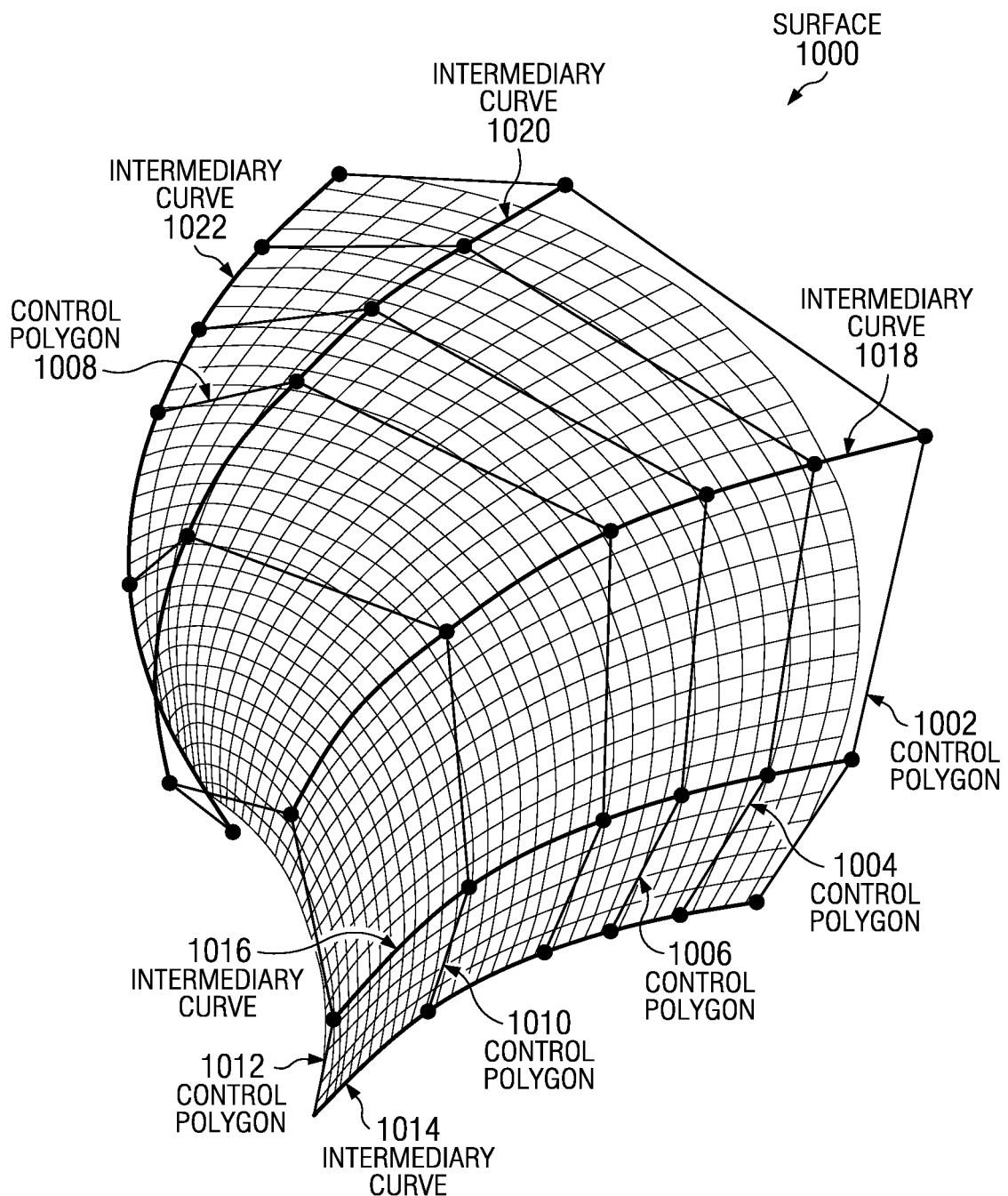
FIG. 10 is a diagram of a surface in accordance with an advantageous embodiment.

With reference now to FIG. 10, a diagram of a surface is depicted in accordance with an advantageous embodiment. Surface 1000 is an illustrative example of one embodiment of a procedurally defined geometry, such as procedurally defined geometry 414 within callback function 404 in FIG. 4.

Control polygons 1002, 1004, 1006, 1008, 1010, and 1012 are an illustrative example of control polygons 914, 916, 918, 920, 922, and 924 in FIG. 9. Each of control polygons 1002, 1004, 1006, 1008, 1010, and 1012 have unique control points, such as control points 926, 928, 930, 932 and 934 in FIG. 9. An intermediary curve is fit through each of the control points of each of control polygons 1002, 1004, 1006, 1008, 1010, and 1012. In an illustrative example, intermediary curves may be fit through control points using a spline data interpolation routine.

For example, intermediary curve 1014 is fit through each control point[$c_0$] of each of control polygons 1002, 1004, 1006, 1008, 1010, and 1012, intermediary curve 1016 is fit through each control point[$c_1$] of each of control polygons 1002, 1004, 1006, 1008, 1010, and 1012, and so on, so that an intermediary curve is fit through each control point of each control polygon for the initial sampled curves. Intermediary curves 1014, 1016, 1018, 1020, and 1022 each run in the opposite direction of the initial sampled curves, and the control polygons for each initial sampled curve. In an illustrative example, if the initial sampled curves are returned as longitudinal curves, the intermediary curves will be constructed as latitudinal curves, and vice versa.

The different components illustrated for surface 1000 are not meant to provide architectural limitations to the manner in which different embodiments may be implemented. The different advantageous embodiments may be implemented in a data processing system including components in addition to or in place of those illustrated for surface 1000. Other components shown in FIG. 10 can be varied from the illustrative examples shown.

Figure 11:
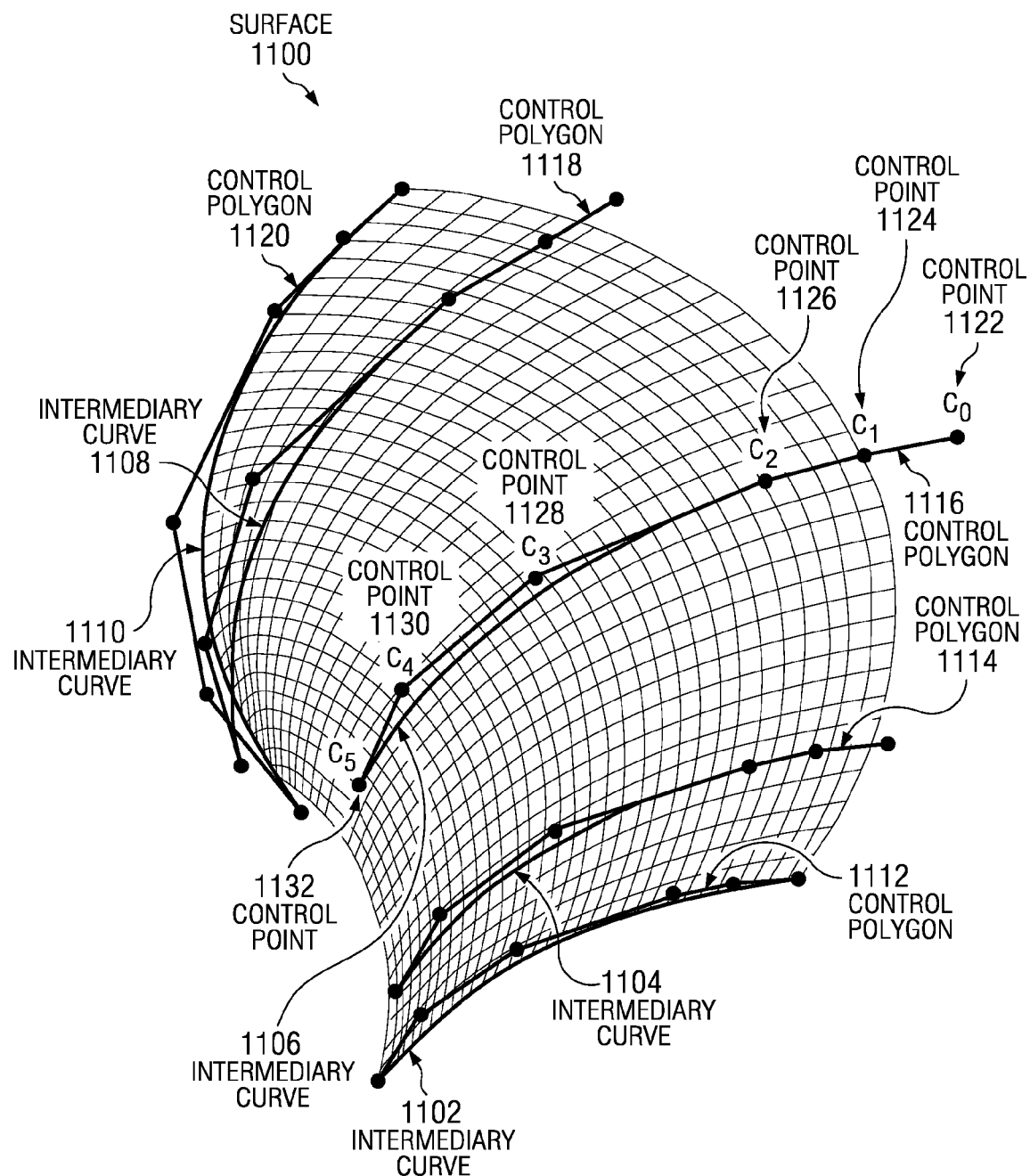
FIG. 11 is a diagram of a surface in accordance with an advantageous embodiment.

With reference now to FIG. 11, a diagram of a surface is depicted in accordance with an advantageous embodiment. Surface 1100 is an illustrative example of one embodiment of a procedurally defined geometry, such as procedurally defined geometry 414 within callback function 404 in FIG. 4.

Surface 1100 depicts intermediary curves 1102, 1104, 1106, 1108, and 1110. Intermediary curves 1102, 1104, 1106, 1108, and 1110 are an illustrative example of intermediary curves 1014, 1016, 1018, 1020, and 1022 in FIG. 1000. Each of intermediary curves 1102, 1104, 1106, 1108, and 1110, has a corresponding control polygon with control points, or coefficients, of their own. In this illustrative example, intermediary curve 1102 has control polygon 1112, intermediary curve 1104 has control polygon 1114, intermediary curve 1106 has control polygon 1116, intermediary curve 1108 has control polygon 1118, and intermediary curve 1110 has control polygon 1120.

In an illustrative example, the control points for control polygon 1116 of intermediary curve 1106 are depicted as control point[$c_0$] 1122, control point[$c_1$] 1124, control point [$c_2$] 1126, control point [$c_3$] 1128, control point [$c_4$] 1130, and control point [$c_5$] 1132.

The different components illustrated for surface 1100 are not meant to provide architectural limitations to the manner in which different embodiments may be implemented. The different advantageous embodiments may be implemented in a data processing system including components in addition to or in place of those illustrated for surface 1100. Other components shown in FIG. 11 can be varied from the illustrative examples shown. As one example, the control points for a given control polygon may vary to include more control points or fewer control points in any given embodiment.

Figure 12:
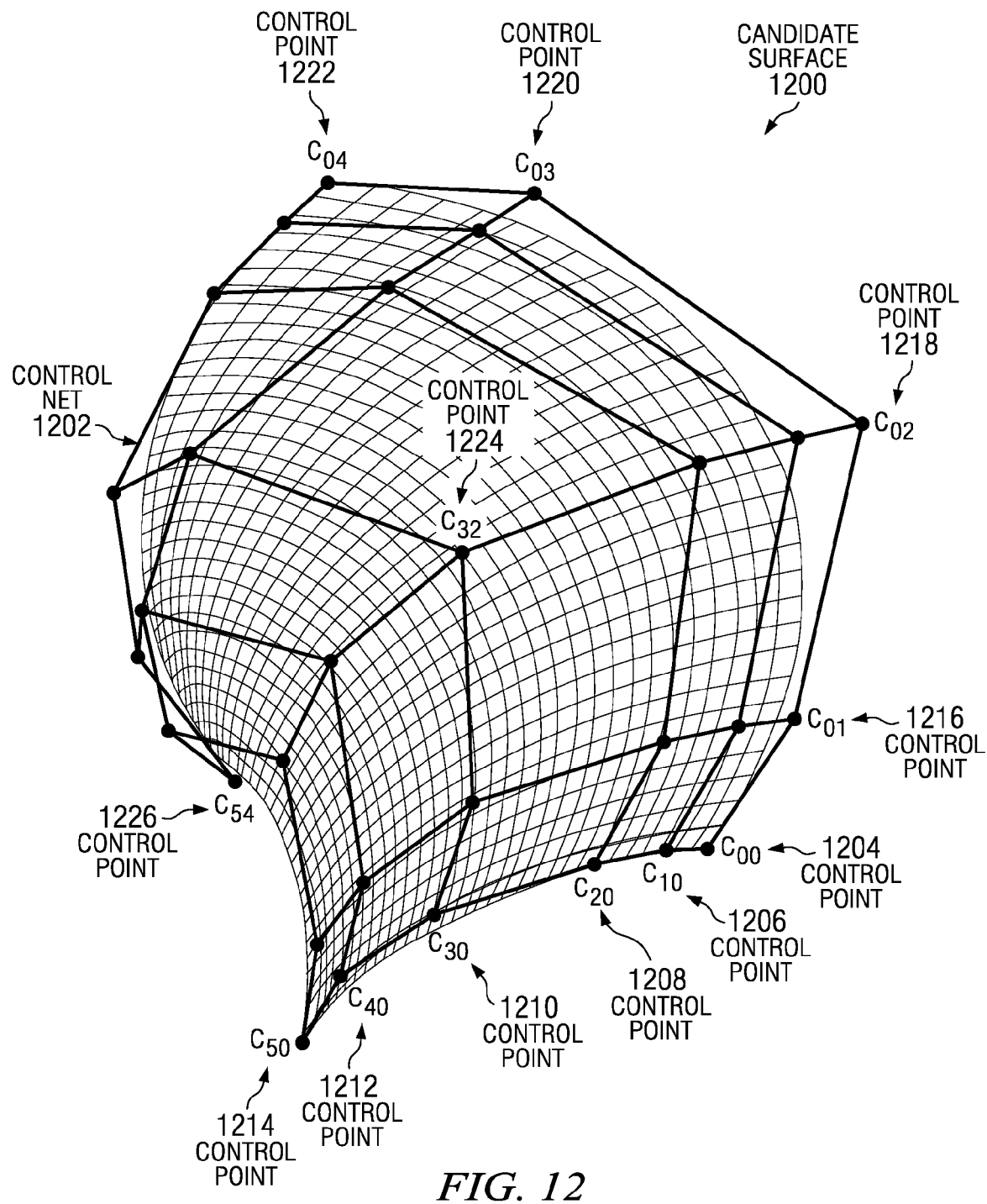
FIG. 12 is a diagram of a candidate surface in accordance with an advantageous embodiment.

With reference now to FIG. 12, a diagram of a control net is depicted in accordance with an advantageous embodiment. Candidate surface 1200 is an illustrative example of one embodiment of a candidate surface, such as candidate curve 422 in FIG. 4.

A spline surface has a unique representation as a linear combination of B-splines: $\Sigma c_{ij} B_i(u) B_j(v)$. When the coefficients $c_{ij}$, which are three-dimensional vectors, are considered as points and connected, the resulting wire-diagram is called a control net.

After the control points for each intermediary curve are determined, the result is a grid of control points that define control net 1202. Control net 1202 prescribes candidate surface 1200. A control net is a rough estimate of a surface that is procedurally defined in a callback function, such as callback function 404 in FIG. 4.

Control net 1202 includes a sequence of control points for each of the control polygons of the intermediary curves. In an illustrative embodiment, control points 1204, 1206, 1208, 1210, 1212, 1214, 1216, 1218, 1220, 1222, 1224, and 1226 represent some of the control points for control net 1202.

For example, control point 1204 has the coefficient [$c_{00}$] because it is at the zero point of the control polygon for the first intermediary curve, such as intermediary curve 1102 in FIG. 11. Control point 1206 has the coefficient [$c_{10}$] because it is at the one point of the control polygon of the first intermediary curve, such as intermediary curve 1102 in FIG. 11, and so on.

Once candidate surface 1200 has been prescribed by control net 1202, candidate surface 1200 can be checked against the required accuracy to see whether of not candidate surface 1200 meets or exceeds the required accuracy. The accuracy check, performed by an accuracy checker such as accuracy checking strategy 420 in FIG. 4, is performed by sampling new curves to get new points on the newly sampled curves, and projecting those new points onto candidate surface 1200. The distance between the new points and candidate surface 1200 can then be computed to determine whether candidate surface 1200 meets or exceeds the required accuracy. If the distance exceeds the required accuracy, the initial sampled curves and the new curves are used to construct a new control net, repeating the process until a candidate surface that meets the required accuracy is produced.

Figure 13:
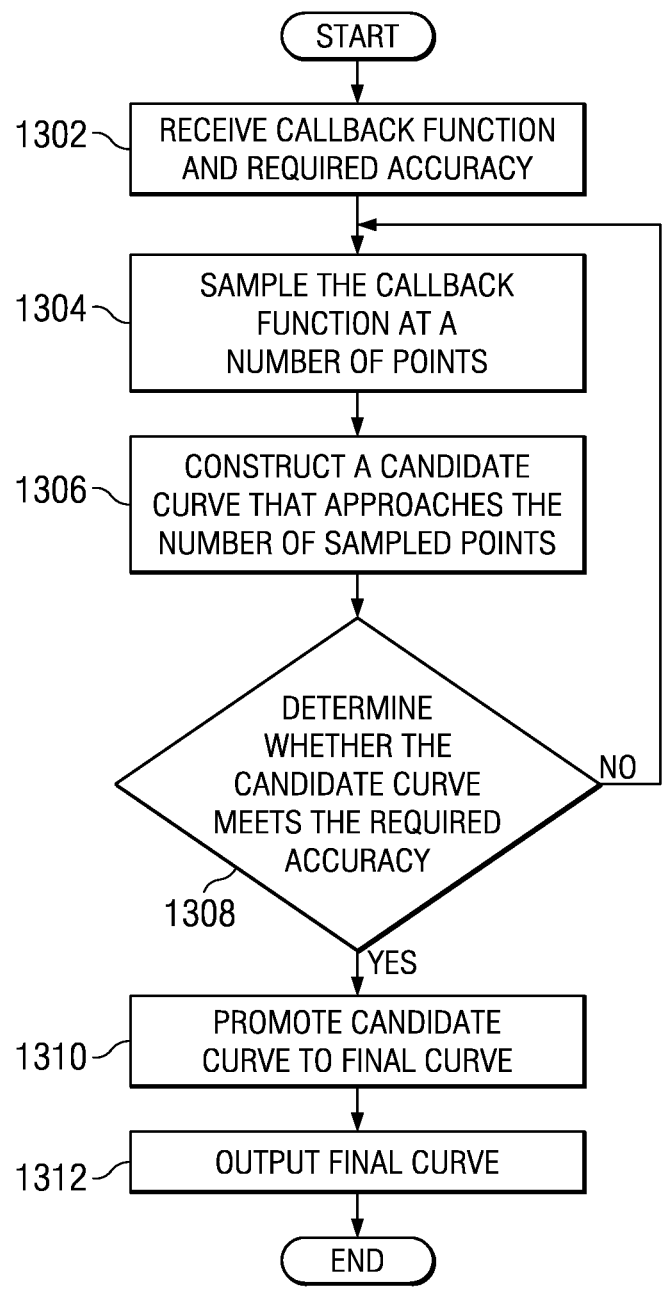
FIG. 13 is a flowchart illustrating a process for generating a computer aided design model in accordance with an advantageous embodiment.

With reference now to FIG. 13, a flowchart illustrating a process for generating a computer aided design model is depicted in accordance with an advantageous embodiment. The process in FIG. 13 may be implemented in a component such as, for example, adaptive sampler 410 in computer aided design environment 400 in FIG. 4.

The process begins by receiving a callback function and a required accuracy (operation 1302). The process samples the callback function at a number of points (operation 1304) using an adaptive sampler, such as adaptive sampler 410 in FIG. 4, for example. The process then constructs a candidate curve through the number of sampled points (operation 1306). The candidate curve is constructed using a curve fitting strategy, such as curve fitting strategy 504 in FIG. 5.

Next, the process determines whether the candidate curve meets the required accuracy (operation 1308). If the candidate curve exceeds the required accuracy, the process returns to operation 1306. If the candidate curve meets the required accuracy, the process promotes the candidate curve to a final curve (operation 1310) and outputs the final curve (operation 1312), with the process terminating thereafter.

Figure 14:
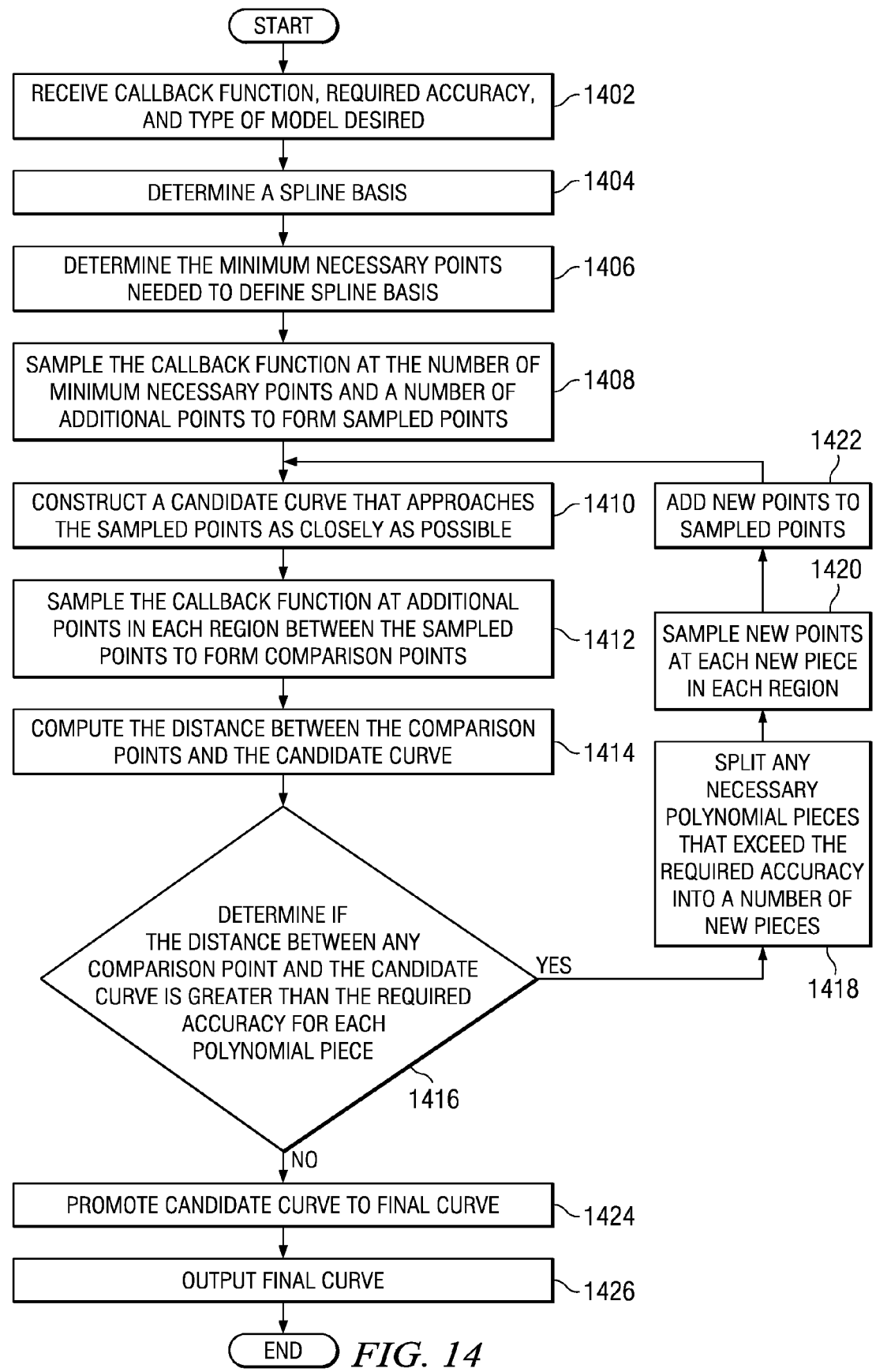
FIG. 14 is a flowchart illustrating a process for generating a curve in accordance with an advantageous embodiment.

With reference now to FIG. 14, a flowchart illustrating a process for generating a curve is depicted in accordance with an advantageous embodiment. The process in FIG. 14 may be implemented in a component such as, for example, adaptive sampler 410 in FIG. 4.

The process begins by receiving a callback function, required accuracy, and type of model desired (operation 1402). The process determines a spline basis (operation 1404) using the type of model desired. The process then determines the minimum necessary points needed to define the spline basis (operation 1406).

Next, the process samples the callback function at the minimum necessary points and a number of additional points to form sampled points (operation 1408). The process constructs a candidate curve that approaches the sampled points as closely as possible (operation 1410). In an advantageous embodiment, the process may construct the candidate curve using a least squares procedure. A least squares procedure uses a method of fitting data that determines the best fit for data by finding the instance of the model for which the sum of the squared residuals has its least value. A residual is the difference between an observed value and the value given by the model. In other words, a least squares procedure adjusts the parameters of a function so as to best fit a data set. In another advantageous embodiment, the process may construct the candidate curve using a geometric approximation scheme.

The process then samples the callback function at additional points in each region between the sampled points to form comparison points (operation 1412). The process computes the distance between the comparison points and the candidate curve (operation 1414). The process then determines if the distance between any comparison point and the candidate curve is greater than the required accuracy for each polynomial piece (operation 1416). A polynomial is an expression constructed from variables and constants, using the operations of addition, subtraction, multiplication, and constant non-negative whole number exponents. For example, in an advantageous embodiment, a polynomial piece may be the region between two sampled points along a curve.

If the distance between any comparison point and the candidate curve is greater than the required accuracy, the process splits any necessary polynomial piece that exceeds the required accuracy into a number of new pieces in each region (operation 1418). As used herein, a number refers to two or more new polynomial pieces. The process then samples new points at each new piece in each region (operation 1420) and adds the new points to the sampled points (operation 1422), and returns to operation 1410.

If the distance between any comparison point and the candidate curve is not greater than the required accuracy, or meets the required accuracy, the process promotes the candidate curve to a final curve (operation 1424) and outputs the final curve (operation 1426) as a computer aided design model, with the process terminating thereafter.

Figure 15:
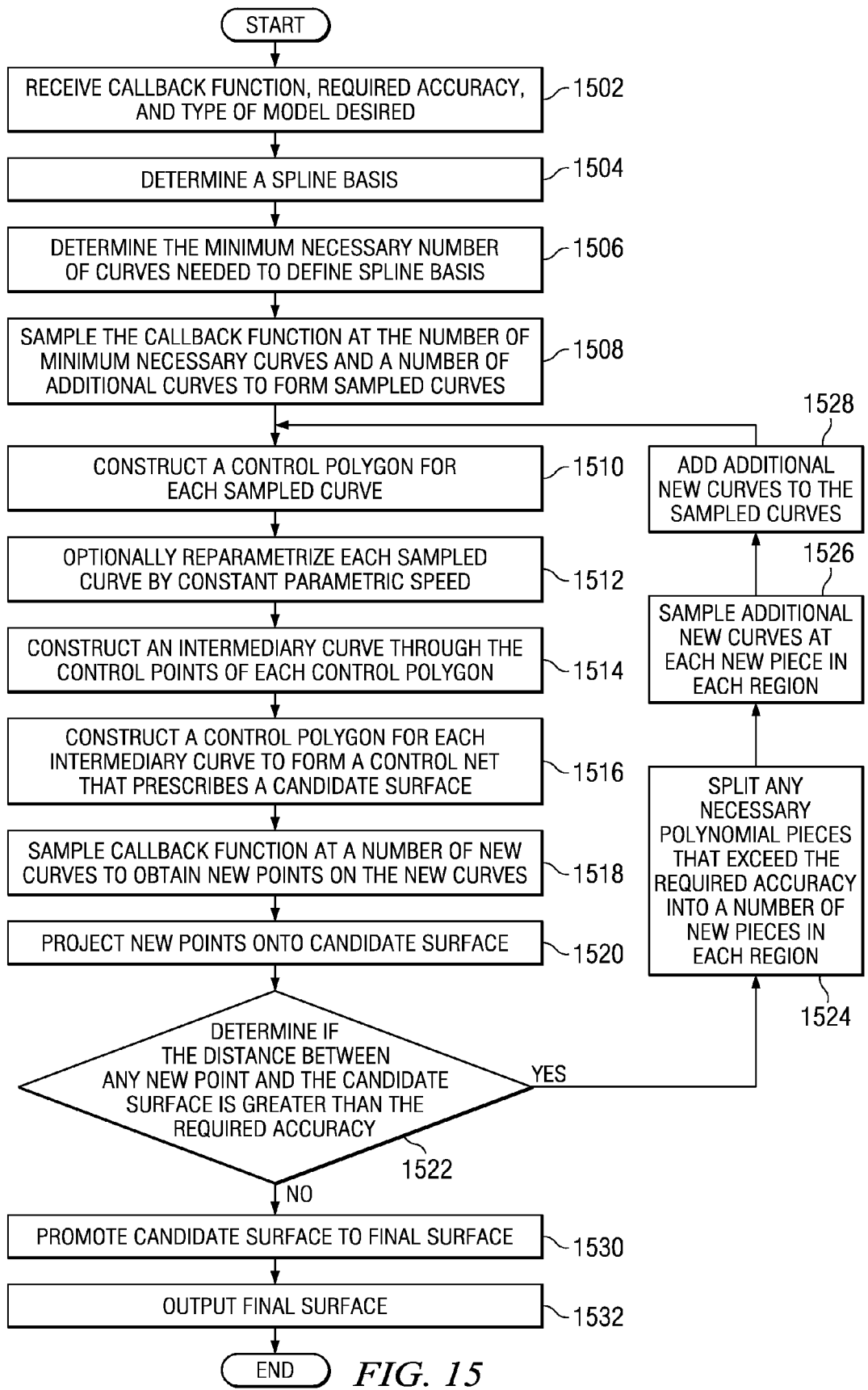
FIG. 15 is a flowchart illustrating a process for generating a surface in accordance with an advantageous embodiment.

With reference now to FIG. 15, a flowchart illustrating a process for generating a surface is depicted in accordance with an advantageous embodiment. The process in FIG. 15 may be implemented in a component such as, for example, adaptive sampler 410 in FIG. 4.

The process begins by receiving a callback function, required accuracy, and type of model desired (operation 1502). The process determines a spline basis (operation 1504) using the type of model desired. The process determines the minimum necessary number of curves needed to define the spline basis (operation 1506). As used herein, a number refers to one or more curves.

Next, the process samples the callback function at the number of minimum necessary curves and a number of additional curves to form a number of sampled curves (operation 1508), such as curves 802, 804, 806, 808, 810, and 812 in FIG. 8. The callback function may be sampled using a sampling strategy, such as sampling strategy 502 in FIG. 5.

The process then constructs a control polygon for each sampled curve (operation 1510), such as control polygons 914, 916, 918, 920, 922, and 924 in FIG. 9. The control polygons may be constructed using a fitting strategy, such as curve and/or surface constructor 514 of fitting strategy 504 in FIG. 5. Each control polygon is defined by a number of control points, or coefficients, such as control point $[c_0]$ 926, control point $[c_1]$ 928, control point $[c_2]$ 930, control point $[c_3]$ 932 and control point $[c_4]$ 934 of control polygon 914 for curve 902 in FIG. 9.

The process optionally reparametrizes each sampled curve by constant parametric speed (operation 1512). Operation 1512 is optional, but if performed, must be performed on each sampled curve.

The process then constructs an intermediary curve through the control points of each control polygon (operation 1514), such as intermediary curves 1014, 1016, 1018, 1020, and 1022 in FIG. 10. The intermediary curves may be constructed using a fitting process, such as fitting process 516 in fitting strategy 504 of FIG. 5. In an illustrative example, the intermediary curves may be fit through control points using a spline data interpolation routine.

The intermediary curves will run in the opposite direction of the initial sampled curves, and the control polygons for each initial sampled curve. In an illustrative example, if the initial sampled curves are returned as longitudinal curves, the intermediary curves will be constructed as latitudinal curves, and vice versa.

The process then constructs a control polygon for each intermediary curve to form a control net that prescribes a candidate surface (operation 1516), such as control net 1202 in FIG. 12. Each intermediary curve has a corresponding control polygon with control points, or coefficients, of their own. The control points of the control polygons for the initial sampled curves and the control points of the control polygons for the intermediary curves combine to form the control net. The control net prescribes a candidate surface.

In an advantageous embodiment, the process may use a surface interpolation procedure to construct the candidate surface. A surface interpolation procedure is an example of a method of constructing new data points within the range of a discrete set of known data points.

Next, the process samples the callback function at a number of new curves to obtain new points on the new curves (operation 1518). The process projects the new points onto the candidate surface (operation 1520). The process determines whether the distance between any new point and the candidate surface is greater than the required accuracy for each polynomial piece (operation 1522). This accuracy check may be performed by accuracy checking strategy 506 in FIG. 5, for example, using distance computation process 518 and accuracy comparison process 520. A polynomial is an expression constructed from variables and constants, using the operations of addition, subtraction, multiplication, and constant non-negative whole number exponents.

If the distance between any new point and the candidate surface is greater than the required accuracy, or exceeds the required accuracy, the process splits any necessary polynomial pieces that exceed the required accuracy into a number of new pieces in each region (operation 1524). The polynomial splitting may be performed using a process such as polynomial splitting process 512 of sampling strategy 502 in FIG. 5, for example. The process samples additional new curves at each new piece in each region (operation 1526) using a points selection process, such as points selection process 510 in FIG. 5, adds the additional new curves to the sampled curves (operation 1528), and returns to operation 1510 in order to construct a new control net that will prescribe a new candidate surface.

If the distance between any new point and the candidate surface is not greater than the required accuracy, or meets the required accuracy, the process promotes the candidate surface to a final surface (operation 1530), and outputs the final surface (operation 1532) as a computer aided design model, such as computer aided design model 412 in FIG. 4, with the process terminating thereafter.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

Thus, the different advantageous embodiments provide a computer implemented method, apparatus, and computer program product for constructing a computer aided design model. User input is received that contains a callback function and a required accuracy. The callback function contains a procedurally defined geometry and the required accuracy specifies the degree of accuracy needed for the computer aided design model. The callback function is sampled at a number of points to form sampled points and a candidate curve is constructed that approaches the sampled points. A determination is made as to whether the candidate curve meets the required accuracy.

The different advantageous embodiments replace a user input of unknowable quantity—how many points to sample along a procedurally defined geometry—with a specification of a known quantity—the required accuracy for a computer aided design model. The different advantageous embodiments also provide computer aided design models that can be freely exchanged between geometric modeling systems in a consistent, repeatable way. Accuracy is improved and the amount of data necessary in a data transfer is reduced between individual systems.

The different advantageous embodiments can take the form of an entirely hardware embodiment, an entirely software embodiment, or an embodiment containing both hardware and software elements. Some embodiments are implemented in software, which includes but is not limited to forms, such as, for example, firmware, resident software, and microcode.

Furthermore, the different embodiments can take the form of a computer program product accessible from a computer-usable or computer-readable medium providing program code for use by or in connection with a computer or any device or system that executes instructions. For the purposes of this disclosure, a computer-usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non limiting examples of a computer-readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W) and DVD.

Further, a computer-usable or computer-readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation to keyboards, touch screen displays, and pointing devices. Different communications adapters may also be coupled to the system to enable the data processing system to become coupled to other data processing systems or remote printers or storage devices through intervening private or public networks. Non-limiting examples are modems and network adapters are just a few of the currently available types of communications adapters.

The description of the different advantageous embodiments has been presented for purposes of illustration and description, and is not intended to be exhaustive or limited to the embodiments in the form disclosed. Many modifications and variations will be apparent to those of ordinary skill in the art. For example, although the different advantageous embodiments have been described with respect to aircraft, other advantageous embodiments may be applied to other types of objects. For example, without limitation, other advantageous embodiments may be applied to a mobile platform, a stationary platform, a land-based structure, an aquatic-based structure, a space-based structure and/or some other suitable object. More specifically, the different advantageous embodiments may be applied to, for example, without limitation, a submarine, a bus, a personnel carrier, tank, a train, an automobile, a spacecraft, a space station, a satellite, a surface ship, a power plant, a dam, a manufacturing facility, a building and/or some other suitable object.

Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for constructing a computer aided design model of an object, the method comprising:
   receiving user input, wherein the user input comprises a callback function and a required accuracy, wherein the callback function contains a procedurally defined geometry, and wherein the required accuracy specifies a degree of accuracy needed for the computer aided design model of the object;
   sampling, by a processor unit, the callback function at a number of points to form sampled points;
   constructing a candidate curve that approaches the sampled points; and
   determining whether the candidate curve meets the required accuracy, determining including
      sampling the callback function at a number of additional points in each region between the sampled points to form comparison points, wherein each region between the sampled points is a polynomial piece;
      computing a distance between each comparison point and the candidate curve; and
      determining whether the distance between any comparison point and the candidate curve is greater than the required accuracy for each region.

2. The method of claim 1, wherein the candidate curve is one of a curve or a surface for the object.

3. The method of claim 2, wherein the object is selected from one of a mobile platform, a stationary platform, a land-based structure, an aquatic-based structure, a space-based structure, an aircraft, a surface ship, a tank, a personnel carrier, a train, a spacecraft, a space station, a satellite, a submarine, an automobile, a power plant, a bridge, a dam, a manufacturing facility, a building, a propeller, a wing, a valve, a rudder, a fuselage, an engine, a cabin of an aircraft, a fairing, a strut, and a wheel.

4. The method of claim 1, wherein the user input further comprises a model type, wherein the model type specifies a type of geometry for the computer aided design model.

5. The method of claim 4, wherein the type of geometry is one of a piecewise linear geometry, a piecewise quadratic geometry, and a piecewise cubic geometry.

6. The method of claim 4, wherein sampling the callback function further comprises:
   determining a spline basis, wherein the spline basis is the type of geometry for the computer aided design model, and wherein the spline basis is determined using the model type;
   determining a minimum number of necessary points needed to define the spline basis, wherein the minimum number of necessary points needed to define the spline basis are a number of points needed to define the type of geometry; and sampling the callback function at the minimum number of necessary points and a number of additional points to form the sampled points.

7. The method of claim 1, further comprising:
responsive to a determination that the candidate curve meets the required accuracy, promoting the candidate curve to a final curve; and
outputting the final curve as the computer aided design model.

8. The method of claim 1, further comprising:
responsive to a determination that the candidate curve exceeds the required accuracy, splitting any necessary polynomial piece into a number of new polynomial pieces, wherein a necessary polynomial piece is the region where the distance between the comparison point of that region and the candidate curve is greater than the required accuracy;
sampling new points at each new polynomial piece; and
adding the new points to the sampled points.

9. The method of claim 8, further comprising:
repeating the steps of constructing the candidate curve and determining whether the candidate curve meets the required accuracy until the candidate curve does meet the required accuracy.

10. An apparatus comprising:
a bus;
a storage device having a stored sampling process; and
a processor unit, wherein the processor unit is configured to execute the sampling process to receive user input, wherein the user input comprises a callback function and a required accuracy, wherein the callback function contains a procedurally defined geometry, and wherein the required accuracy specifies a degree of accuracy needed for the computer aided design model of an object; sample the callback function at a number of points to form sampled points; construct a candidate curve that approaches the sampled points; and determine whether the candidate curve meets the required accuracy, including
sampling the callback function at a number of additional points in each region between the sampled points to form comparison points, wherein each region between the sampled points is a polynomial piece;
computing a distance between each comparison point and the candidate curve; and
determining whether the distance between any comparison point and the candidate curve is greater than the required accuracy for each region.

11. The apparatus of claim 10, wherein the candidate curve is one of a curve or a surface for the object.

12. The apparatus of claim 11, wherein the object is selected from one of a mobile platform, a stationary platform, a land-based structure, an aquatic-based structure, a space-based structure, an aircraft, a surface ship, a tank, a personnel carrier, a train, a spacecraft, a space station, a satellite, a submarine, an automobile, a power plant, a bridge, a dam, a manufacturing facility, a building, a propeller, a wing, a valve, a rudder, a fuselage, an engine, a cabin of an aircraft, a fairing, a strut, and a wheel.

13. The apparatus of claim 10, wherein the user input further comprises a model type, wherein the model type specifies a type of geometry for the computer aided design model.

14. The apparatus of claim 13, wherein the type of geometry is one of a piecewise linear geometry, a piecewise quadratic geometry, and a piecewise cubic geometry.

15. The apparatus of claim 13, wherein the processor unit is further configured to execute the sampling process to:
determine a spline basis, wherein the spline basis is the type of geometry for the computer aided design model, and wherein the spline basis is determined using the model type;
determine a minimum number of necessary points needed to define the spline basis, wherein the minimum number of necessary points needed to define the spline basis are a number of points needed to define the type of geometry; and
sample the callback function at the minimum number of necessary points and a number of additional points to form sampled points.

16. The apparatus of claim 10, wherein the processor unit is further configured to execute the sampling process to:
responsive to a determination that the candidate curve meets the required accuracy, promote the candidate curve to a final curve; and
output the final curve as the computer aided design model.

17. The apparatus of claim 10, wherein the processor unit is further configured to execute the sampling process to:
responsive to a determination that the candidate curve exceeds the required accuracy, split any necessary polynomial piece into a number of new polynomial pieces, wherein a necessary polynomial piece is the region where the distance between the comparison point of that region and the candidate curve is greater than the required accuracy;
sample new points at each new polynomial piece; and
add the new points to the sampled points.

18. The apparatus of claim 17, wherein the processor unit is further configured to execute the sampling process to:
repeat the steps of constructing the candidate curve and determining whether the candidate curve meets the required accuracy until the candidate curve does meet the required accuracy.

19. A computer program product on a nontransitory computer readable storage medium with computer usable program code for constructing a computer aided design model of an object, the computer program product comprising:
computer usable program code for receiving user input, wherein the user input comprises a callback function and a required accuracy, wherein the callback function contains a procedurally defined geometry, and wherein the required accuracy specifies a degree of accuracy needed for the computer aided design model of the object;
computer usable program code for sampling the callback function at a number of points to form sampled points;
computer usable program code for constructing a candidate curve that approaches the sampled points; and
computer usable program code for determining whether the candidate curve meets the required accuracy, determining including
sampling the callback function at a number of additional points in each region between the sampled points to form comparison points, wherein each region between the sampled points is a polynomial piece;
computing a distance between each comparison point and the candidate curve; and
determining whether the distance between any comparison point and the candidate curve is greater than the required accuracy for each region.

20. The computer program product of claim 19, wherein the candidate curve is one of a curve or a surface for the object.

21. The computer program product of claim 20, wherein the object is selected from one of a mobile platform, a stationary platform, a land-based structure, an aquatic-based structure, a space-based structure, an aircraft, a surface ship, a tank, a personnel carrier, a train, a spacecraft, a space station, a satellite, a submarine, an automobile, a power plant, a bridge, a dam, a manufacturing facility, a building, a propeller, a wing, a valve, a rudder, a fuselage, an engine, a cabin of an aircraft, a fairing, a strut, and a wheel.

22. The computer program product of claim 19, wherein the user input further comprises a model type, wherein the model type specifies a type of geometry for the computer aided design model.

23. The computer program product of claim 22, wherein the type of geometry is one of a piecewise linear geometry, a piecewise quadratic geometry, and a piecewise cubic geometry.

24. The computer program product of claim 22, wherein sampling the callback function further comprises:
   computer usable program code for determining a spline basis, wherein the spline basis is the type of geometry for the computer aided design model, and wherein the spline basis is determined using the model type;
   computer usable program code for determining a minimum number of necessary points needed to define the spline basis, wherein the minimum number of necessary points needed to define the spline basis are a number of points needed to define the type of geometry; and
   computer usable program code for sampling the callback function at the minimum number of necessary points and a number of additional points to form sampled points.

25. The computer program product of claim 19, further comprising:
   computer usable program code for responsive to a determination that the candidate curve meets the required accuracy, promoting the candidate curve to a final curve; and
   computer usable program code for outputting the final curve as the computer aided design model.

26. The computer program product of claim 19, further comprising:
   computer usable program code for, responsive to a determination that the candidate curve exceeds the required accuracy, splitting any necessary polynomial piece into a number of new polynomial pieces, wherein a necessary polynomial piece is the region where the distance between the comparison point of that region and the candidate curve is greater than the required accuracy;
   computer usable program code for sampling new points at each new polynomial piece; and
   computer usable program code for adding the new points to the sampled points.

27. The computer program product of claim 26, further comprising:
   computer usable program code for repeating the steps of constructing the candidate curve and determining whether the candidate curve meets the required accuracy until the candidate curve does meet the required accuracy.

28. A method for constructing a computer aided design model of an object, the computer implemented method comprising:
   receiving input, wherein the input comprises a callback function and a required accuracy, wherein the callback function contains a procedurally defined geometry, and wherein the required accuracy specifies a degree of accuracy needed for the computer aided design model of the object;
   sampling, by a processor unit, the callback function at a number of curves to form sampled curves;
   constructing a candidate surface that approaches the sampled curves; and
   determining whether the candidate surface meets the required accuracy, determining including
      sampling the callback function at a number of new curves to obtain new points on the newly sampled curves;
      projecting the new points onto the candidate surface; and
         determining whether the distance between the candidate surface and any new point in the new points is greater than the required accuracy.

29. The method of claim 28, wherein the input further comprises a model type, wherein the model type specifies a type of geometry for the computer aided design model of the object.

30. The method of claim 29, wherein the type of geometry is one of a piecewise linear geometry, a piecewise quadratic geometry, and a piecewise cubic geometry.

31. The method of claim 30, wherein sampling the callback function further comprises:
   determining a spline basis, wherein the spline basis is the type of geometry for the computer aided design model, and wherein the spline basis is determined using the model type;
   determining a minimum number of necessary curves needed to define the spline basis, wherein the minimum number of necessary curves needed to define the spline basis are a number of curves needed to define the type of geometry; and
   sampling the callback function at the minimum number of necessary curves and a number of additional curves to form the sampled curves.

32. The method of claim 28, wherein constructing the candidate surface further comprises:
   constructing a control polygon for each sampled curve in the sampled curves to form a number of control polygons having a number of control points;
   constructing an intermediary curve through each control point in the number of control points to form a number of intermediary curves;
   constructing an intermediary control polygon for each intermediary curve in the number of intermediary curves to from a control net that prescribes the candidate surface, wherein the control net includes all of the control points for the number of intermediary control polygons.

33. The method of claim 28, further comprising:
   responsive to a determination that the candidate surface meets the required accuracy, promoting the candidate surface to a final surface; and
   outputting the final surface as the computer aided design model for the object.

34. The method of claim 28, further comprising:
   responsive to the determination that the distance between the candidate surface and any new point is greater than the required accuracy, splitting any necessary polynomial pieces that exceeds the required accuracy into a number of new pieces in each region, wherein a necessary polynomial piece is the region where the distance between the new point of that region and the candidate surface is greater than the required accuracy;
   sampling additional new curves at each new polynomial piece in each region; and
   adding the additional new curves to the sampled curves.

35. The method of claim 34, further comprising:
   repeating the steps of constructing the candidate surface and determining whether the candidate surface meets the required accuracy until the candidate surface does meet the required accuracy.

* * * * *